(12) United States Patent  
Ma

(10) Patent No.: US 9,063,709 B2
(45) Date of Patent: Jun. 23, 2015

(54) FAN ASSEMBLY

(75) Inventor: Xiao-Feng Ma, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 429 days.

(21) Appl. No.: 13/586,901

(22) Filed: Aug. 16, 2012

(65) Prior Publication Data

US 2013/0287544 A1 Oct. 31, 2013

(30) Foreign Application Priority Data

Apr. 26, 2012 (CN) .......................... 2012 1 0125730

(51) Int. Cl.
F04D 13/00 (2006.01)
G06F 1/20 (2006.01)
H05K 7/20 (2006.01)
F04D 25/06 (2006.01)

(52) U.S. Cl.
CPC .............. *G06F 1/20* (2013.01); *F04D 25/0613* (2013.01); *H05K 7/20172* (2013.01)

(58) Field of Classification Search
CPC .... H05K 7/20172; G06F 1/20; F04D 25/0613
USPC ........................ 361/679.48; 415/213.1, 214.1
See application file for complete search history.

(56) References Cited

U.S. PATENT DOCUMENTS 7,312,989 B2 * 12/2007 Chen ............................. 361/695
8,708,644 B2 * 4/2014 Ma et al. ....................... 415/119
2013/0156597 A1 * 6/2013 Sun ............................ 416/244 R

* cited by examiner

*Primary Examiner* — Dwayne J White
*Assistant Examiner* — Jason Fountain
(74) *Attorney, Agent, or Firm* — Novak Druce Connolly Bove + Quigg LLP

(57) ABSTRACT

A fan assembly includes a guide rail, a number of fan brackets slidably mounted to the guide rail, an air blocking member slidably mounted to the guide rail to fill a space between two fan brackets, and a number of fans correspondingly fixed to the fan brackets. To relocate the fans, the fan brackets and the air blocking members are slid out of the guide rail and are remounted to the guide rail in a different order.

7 Claims, 3 Drawing Sheets

FAN ASSEMBLY

BACKGROUND

1. Technical Field

The present disclosure relates to a device for fixing a plurality of fans.

2. Description of Related Art

In an information processing apparatus, e.g. a computer, fans may be used to assist in dissipating heat generated by elements mounted in a chassis of the information handling apparatus. Generally, the fans are fixed in one position in the chassis. As a result, if the electronic elements need to be relocated, the fans may no longer dissipate heat effectively.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
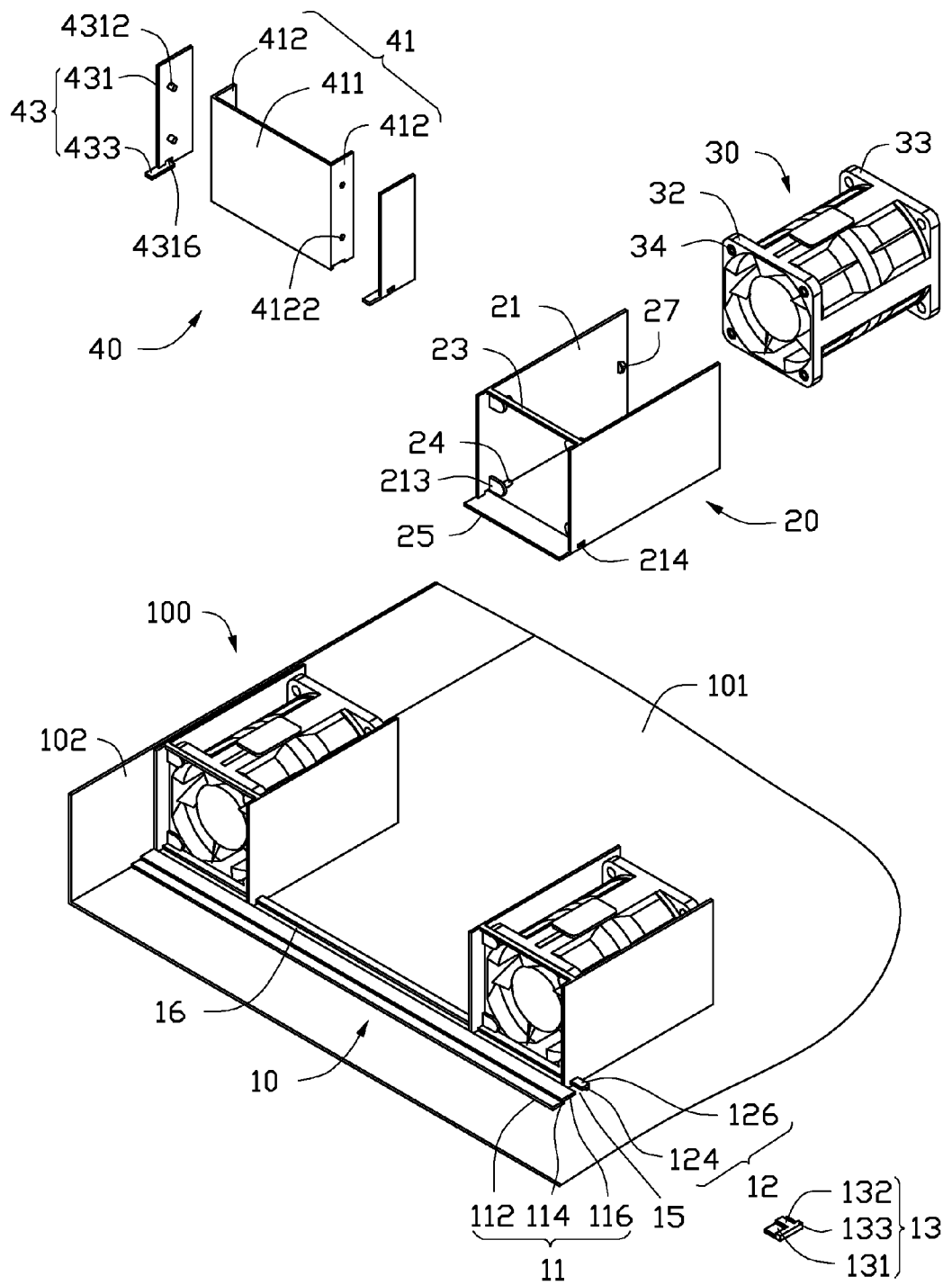
FIG. 1 is an exploded, isometric view of an exemplary embodiment of a fan assembly, together with a chassis.
Figure 2:
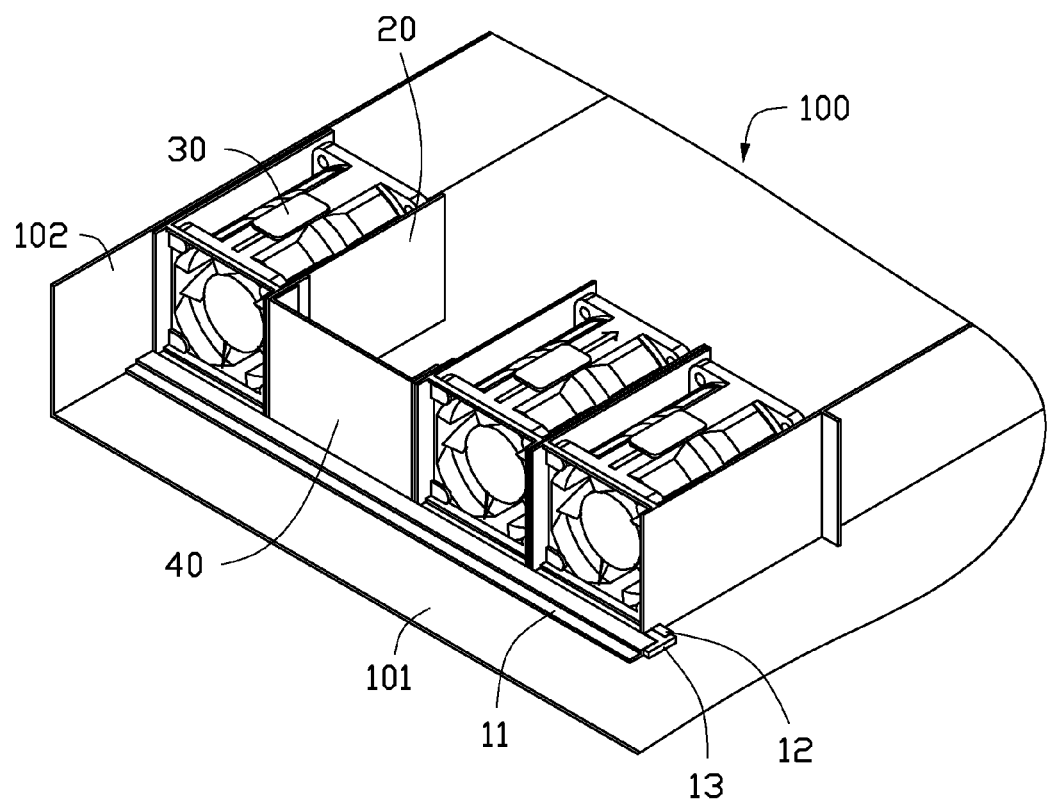
FIGS. 2 and 3 are assembled, isometric views of FIG. 1, but showing different states of use.

Referring to FIGS. 1 and 2, an exemplary embodiment of a fan assembly is shown. The fan assembly can be mounted in a chassis 100 of an information handling apparatus. The fan assembly includes a guide rail 10, a stopping member 13, a plurality of fan brackets 20, a plurality of fans 30, and an air blocking member 40.

The guide rail 10 is fixed to a bottom plate 101 of the chassis 100. An end of the guide rail 10 abuts a side plate 102 of the chassis 100. The guide rail 10 includes a first rail body 11, and a second rail body 12. The first rail body 11 includes a lengthwise fixing board 112 fixed to the bottom plate 101 of the chassis 100, a bounding board 114 perpendicularly extending up from a side of the fixing board 112, and a guiding board 116 extending from a top of the bounding board 114 in a direction opposite to the fixing board 112. The second rail body 12 is substantially L-shaped, and includes a bounding board 124 extending up from the bottom plate 101 and parallel to the bounding board 114, and a guiding board 126 perpendicularly extending from a top of the bounding board 124 towards the guiding board 116. The bottom plate 101, the bounding boards 114 and 124, and the guiding boards 116 and 126 bind a slide passage 15. An opening 16 is defined between the guiding boards 116 and 126 communicating with the slide passage 15.

The stopping member 13 includes a lower piece 131 with a slightly less width than a width of the slide passage 15, an upper piece 132 with a slightly less width than a width of the opening 16, parallel to the lower piece 131, and a connection portion 133 connected between the lower piece 131 and the upper piece 132.

Each of the fan brackets 20 includes two opposite sidewalls 21, a beam 23 connected between tops of front ends of the sidewalls 21, and a sliding board 25 connected between bottoms of the sidewalls 21 and perpendicularly extending out of the front ends of the sidewalls 21. Two tabs 213 perpendicularly extend in from an inner side of each of the sidewalls 21, adjacent a front end of the sidewall 21. A mounting pin 24 perpendicularly extends from a back side of each of the tabs 213. A notch 214 is defined in each of the sidewalls 21, adjacent to the bottom of the sidewall 21 and the sliding board 25. An abutting protrusion 27 protrudes in from the inner side of each of the sidewalls 21, adjacent to a rear end of the sidewall 21.

Each of the fans 30 includes a front end plate 32 defining four corner holes 34, and a rear end plate 33 opposite to the front end plate 32.

The air blocking member 40 includes an air blocking plate 41, and two attachment plates 43. The air blocking plate 41 includes a blocking portion 411, and two side portions 412 perpendicularly extending from opposite sides of the blocking portion 411. Each of the side portions 412 defines two fixing holes 4122. Each of the attachment plates 43 includes a plate body 431, and a sliding piece 433 perpendicularly extending forward from a bottom of the plate body 431. Two mounting pins 4312 protrude from the plate body 431. A notch 4316 is defined in the bottom of the plate body 431, adjacent to the sliding piece 433.

Referring to FIG. 2, in assembly, one of the fans 30 is sandwiched by the sidewalls 21 of one of the fan brackets 20. The mounting pins 24 of the fan bracket 20 correspondingly extend into the corner holes 34 of the front end plate 32 of the fan 30. The abutting protrusions 27 abut against the rear end plate 33. Therefore, the fan 30 is fixed in the fan bracket 20. Accordingly, the other fans 30 are correspondingly fixed in the other fan brackets 20. The attachment plates 43 are respectively fixed to the outsides the side portions 412 of the air blocking plate 41. The mounting pins 4312 of the attachment plates 43 engage in the corresponding fixing holes 4122 of the air blocking plate 41. The fan brackets 20 together with the corresponding fans 30, and the air blocking member 40 are slidably mounted to the guide rail 10 in an order according to a heat dissipation requirement of the chassis 100. The sliding boards 25 of the fan brackets 20 and the sliding pieces 433 of the air blocking member 40 slide into the slide passage 15 from an end of the guide rail 10 opposite to the side plate 102 of the chassis 100. Correspondingly, the second rail body 12 slidably engages in the notches 216 of the fan brackets 30 and the notches 4316 of the air blocking member 40. The stopping member 13 is manipulated to make the lower piece 131 and the upper piece 132 respectively extend into the slide passage 15 and the opening 15, and the connection portion 133 abuts ends of the first and second rail bodies 11 and 12 opposite to the side plate 102. Therefore, the fan brackets 20 and the air blocking member 40 are prevented from disengaging from the guide rail 10. The air blocking member 40 fills a space between two adjacent fan brackets 20 to prevent air from flowing through the space.

Figure 3:
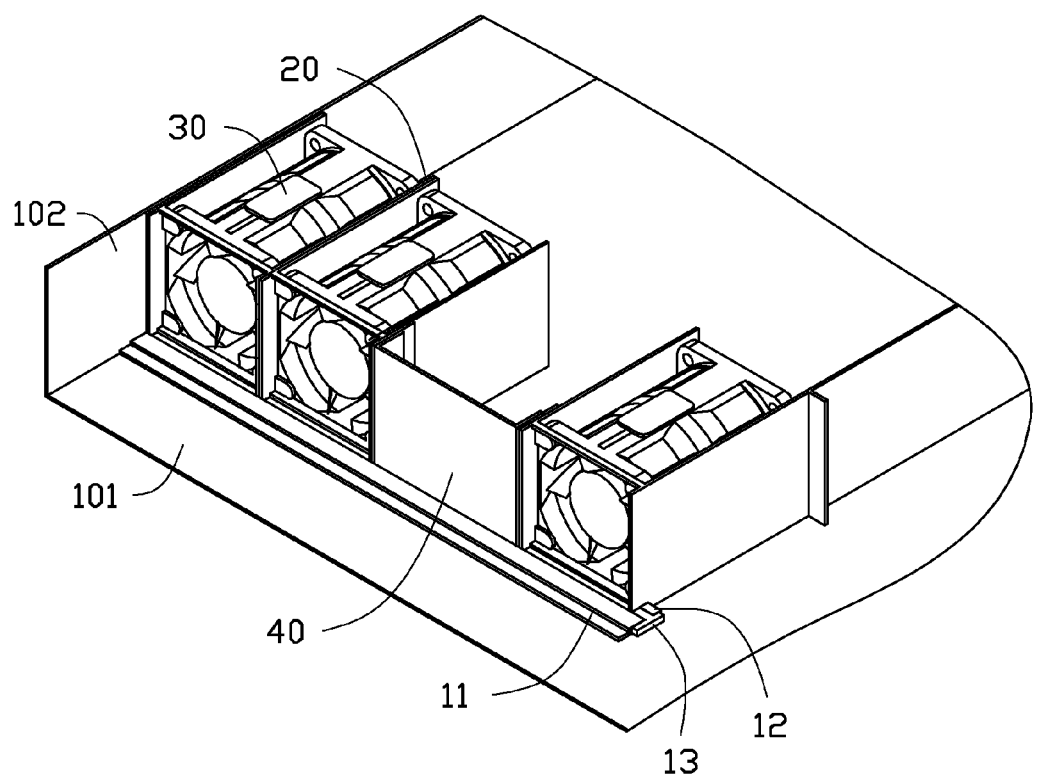

Referring to FIG. 3, to relocate one or more fans 30, the stopping member 13 is detached from the first and second rail bodies 11 and 12. The fan brackets 20 and the air blocking member 40 slide out of the slide passage 15 through the end of the slide passage 15 opposite to the side plate 102. The fan brackets 20 and the air blocking member 40 are slidably mounted to the guide rail 10 in a different order, thereby relocating the corresponding fans 30 for a changed heat dissipation requirement of the chassis 100.

It could be understood that one more fan bracket 30 together with a fan 20 would be mounted to the guide rail 10 to replace the air blocking member 40. On the other hand, more air blocking members 40 would be mounted to the guide rail 10 to replace the corresponding air brackets 20.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A fan assembly for being mounted in a chassis, the chassis comprising a bottom plate and a side plate extending up from a side of the bottom plate, the fan assembly comprising:
 a guide rail comprising a first rail body and a second rail body both secured to the bottom plate of the chassis, wherein each of the first and second rail bodies comprises a lengthwise bounding board, and a guiding board, the bounding boards of the first and second rail bodies are parallel to each other, the guide boards of the first and second rail bodies extend from tops of the corresponding bounding boards towards each other, a slide passage is bounded by the bottom plate, the bounding boards, and the guiding boards, and an opening is defined between the guiding boards of the first and second rail bodies and communicates with the slide passage;
 a plurality of fan brackets each comprising two opposite sidewalls, and a sliding board connected between bottoms of the sidewalls and slidably received in the slide passage of the guide rail, each of the sidewalls defining a notch adjacent to the sliding board, the second rail body of the guide rail slidably extending through the notches of the sidewalls of the fan brackets; and
 a plurality of fans correspondingly fixed in the fan bracket.

2. The fan assembly of claim 1, wherein each of the fans comprises a front end plate defining four corner holes, and a rear end plate, two tabs perpendicularly extending from an inner side of each of the sidewalls of each of the fan bracket, a mounting pin perpendicularly extends from a back side of each of the tabs, each of the fans is sandwiched between the sidewalls of a corresponding fan bracket, the mounting pins of the fan bracket correspondingly extend into the corner holes of the front end plate of the fan.

3. The fan assembly of claim 2, wherein an abutting protrusion protrudes from the inner side of each of the sidewalls of each of the fan bracket, and abuts the rear end plate of a corresponding fan.

4. The fan assembly of claim 1, further comprising a stopping member, wherein one of two opposite ends of the guide rail abuts the side plate of the chassis, and the stopping member is fixed to the other end of the guide rail.

5. The fan assembly of claim 4, wherein the stopping member comprises a lower piece engaged in the slide passage of the guide rail, an upper piece parallel to the lower piece and engaged in the opening of the guide rail, and a connection portion connected between the lower piece and the upper piece, the connection portion abuts ends of the first and second rail bodies opposite to the slide plate of the chassis.

6. The fan assembly of claim 1, further comprising at least one air blocking member slidably mounted to the guide rail and filling a space between two adjacent fan brackets.

7. The fan assembly of claim 6, wherein each of the at least one air blocking member comprises an air blocking plate, and two attachment plates fixed to opposite sides of the air blocking plate, each of the attachment plates comprises a sliding piece extending from a bottom of the attachment plate and slidably received in the air passage of the guide rail, and defines a notch adjacent to the sliding piece, the second rail body of the guide rail slidably extends through the notches of the attachment plates.

\* \* \* \* \*